(12) United States Patent
Lee et al.

(10) Patent No.: US 6,238,965 B1
(45) Date of Patent: May 29, 2001

(54) METHOD FOR FORMING A TITANIUM DIOXIDE LAYER

(75) Inventors: Ming-Kwei Lee; Wen-Han Hung, both of Kaohsiung (TW)

(73) Assignee: Winbond Electronics Corp. (TW)

( * ) Notice: Subject to any disclaimer, the term of this patent is extended or adjusted under 35 U.S.C. 154(b) by 0 days.

(21) Appl. No.: 09/306,080

(22) Filed: May 6, 1999

(30) Foreign Application Priority Data

Sep. 28, 1998 (TW) ................................. 87116110

(51) Int. Cl.[7] ................................. H01L 21/8242
(52) U.S. Cl. ................................. 438/240; 438/767
(58) Field of Search ................................. 438/240, 609, 438/610, 763, 781, 785, 629, 676, 677, 678, 767

(56) References Cited

U.S. PATENT DOCUMENTS 6,066,359 * 5/2000 Yao et al. ..................... 427/126.3

\* cited by examiner

*Primary Examiner*—David Nelms
*Assistant Examiner*—Quoc Huang
(74) *Attorney, Agent, or Firm*—Madson & Metcalf

(57) ABSTRACT

A method for forming a titanium dioxide layer is disclosed. The method includes the steps of providing a titanium-containing material, adding an acid substance to the titanium-containing material to form a mixture, and exposing the device to the mixture to form the titanium dioxide layer thereon. Such a method can be applied for forming a titanium dioxide layer on a semiconductor device, a silicon substrate, an integrated circuit, a photoelectric device, etc.

20 Claims, 10 Drawing Sheets

METHOD FOR FORMING A TITANIUM DIOXIDE LAYER

FIELD OF THE INVENTION

The present invention is related to a method for forming a titanium dioxide layer.

BACKGROUND OF THE INVENTION

Generally, in the manufacturing processes for integrated circuits, semiconductor devices, and photoelectric devices, a titanium dioxide film has been extensively used. Titanium dioxide can be applied in a memory with a high capacity (such as dynamic random access memory (DRAM)) because of its higher dielectric constant, or can be applied in photoelectric devices (for example, waveguide, filter, antireflective coating, etc.) due to its high refractive index.

The most commonly used method for forming a titanium dioxide includes: (1) reactive sputtering; (2) sol-gel growing method which is performed at 800° C.; (3) plasma enhanced chemical vapor deposition which is executed at less than 400° C. However, high radiation generated in the sputtering process will damage the device. Moreover, high temperature required for the reactive sputtering process or sol-gel growing method also causes a damage to the fabricated device. If titanium dioxide can be grown at a lower temperature, the damage resulting from radiation and high temperature can be avoided.

Liquid phase deposition (LPD) is a method of forming a film at about room temperature so that this method has a great developing potential in the processes for manufacturing integrated circuits, semiconductor devices, and photoelectric devices.

In the previous studies about forming titanium dioxide film by liquid phase deposition, not only is the coverage of the formed titanium dioxide film not so good but also a few changes of the operating parameters will significantly influence the growth quality because of too slow deposition rate (less than 6 Å/min) and unstable growth. Therefore, the titanium dioxide film formed by the prior technique can not be applied in the production line due to low throughput and unstable quality.

Therefore, it is desirable to develop an effective method to solve the above-mentioned problems.

SUMMARY OF THE INVENTION

An object of the present invention is to provide a method for forming a titanium dioxide layer on a device.

The method includes the steps of providing a titanium-containing material, adding an acid substance to the titanium-containing material to obtain a mixture, and exposing the device to the mixture to form the titanium dioxide layer thereon.

This method is characterized by that nitric acid is added to the raw material $H_2TiF_6$ for increasing the growth rate of titanium dioxide layer and enhancing its stability. Because nitrous acid is often contained in nitric acid solution, both of them will spontaneously react with each other to provide a great number of electron holes so that elemental titanium can be reduced from the raw material $H_2TiF_6$ and accepts the electron hole provided by nitric acid to form titanium ion and then to become titanium dioxide.

Preferably, the titanium-containing material is $H_2TiF_6$. The concentration of the titanium-containing material is about 6M.

The acid substance is one selected from a group consisting of nitric acid, boric acid, and a mixture thereof, wherein the concentration of the nitric acid is preferably ranged from 0.1M to 0.5M and the concentration of the boric acid is preferably ranged from 0.1M to 0.5M.

The suitable device is one selected from a group consisting of a semiconductor device, a silicon substrate, an integrated circuit, and a photoelectric device.

In accordance with one aspect of the present invention, the titanium dioxide layer is formed by a liquid phase deposition which is performed preferably at a temperature ranged between 20° C. to 40° C. for 2 to 30 minutes.

Another object of the present invention is to provide a method for forming a titanium dioxide layer on a semiconductor device. The method includes the steps of cleaning the semiconductor device, providing a titanium-containing material and adding an acid substance to the titanium-containing material to obtain a mixture, and exposing the cleaned semiconductor device to the mixture to form the titanium dioxide layer thereon.

The present invention may best be understood through the following description with reference to the accompanying drawings, in which:

DETAILED DESCRIPTION OF THE PREFERRED EMBODIMENT

Figure 1:
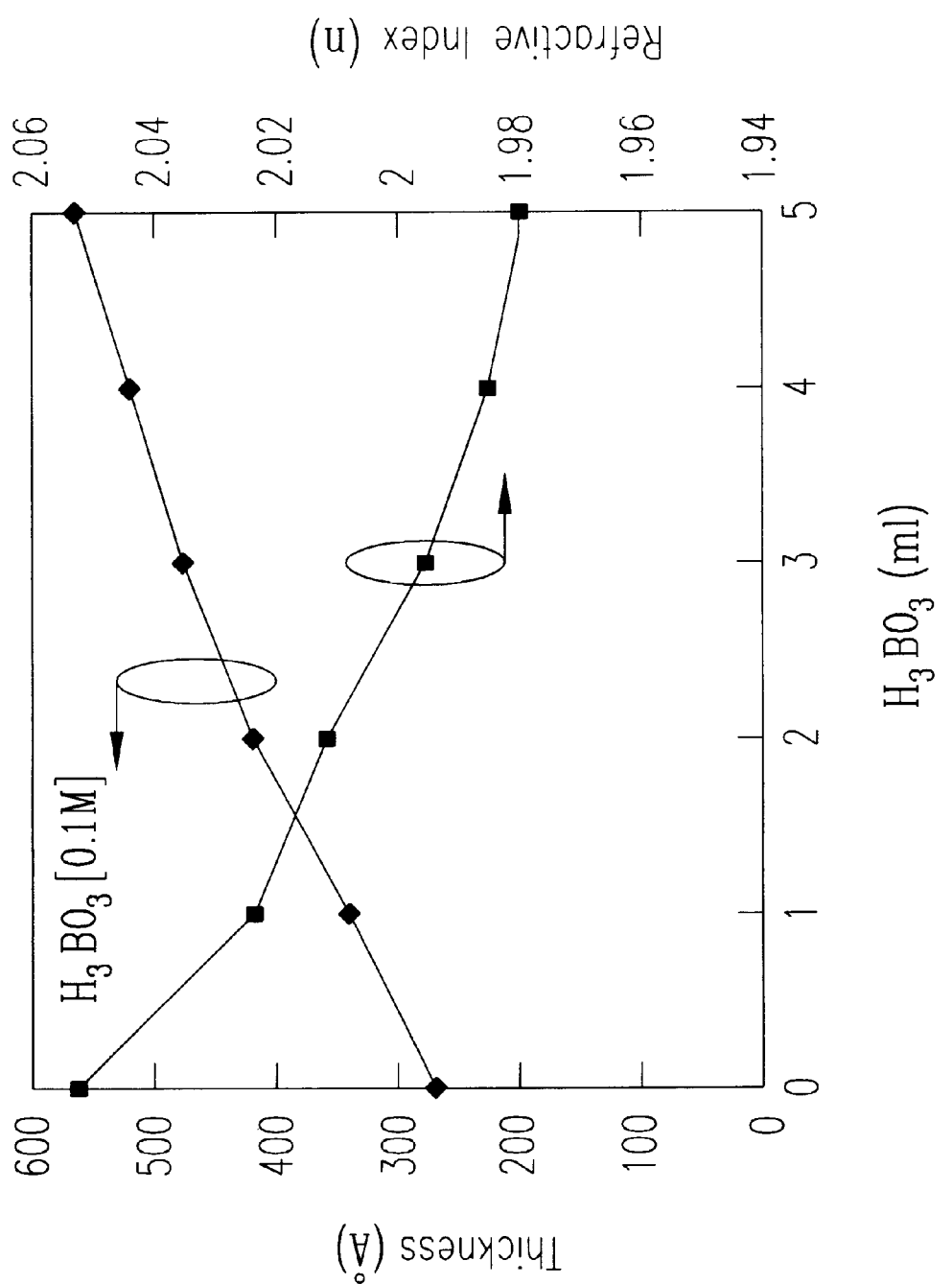
FIG. 1 is a graph showing the relationship between the volume of boric acid and the thickness and refractive index of the titanium dioxide layer in the first preferred embodiment of the method according to the present invention.

The present invention will now be described in more detail with reference to the following embodiments. It is to be noted that the following descriptions of the preferred embodiments of this invention are presented herein for the purpose of illustration and description only. It is not intended to be exhaustive or to be limited to the precise form disclosed.

The present invention provides a method for forming a titanium dioxide layer on a device, which is characterized by that nitric acid is added to the raw material $H_2TiF_6$ for increasing the growth rate of titanium dioxide layer and enhancing its stability. Because nitrous acid is often contained in nitric acid solution, both of them will spontaneously react with each other to provide a great number of electron holes so that elemental titanium can be reduced from the raw material $H_2TiF_6$ and accepts the electron hole provided by nitric acid to form titanium ion and then to become titanium dioxide.

In order to further understand the present invention, the principle is detailedly described as follows.

Typically, the reaction equations of forming titanium dioxide by liquid phase deposition are as follows:

  (1)

  (2)

By the above-described reactions, its growth rate is less than 6Å/min, which is not suitable to be applied in the production line. Therefore, the present invention develops an improved method, that is, adding nitric acid to the raw material $H_2TiF_6$ for facilitating its growth rate. Its principle is described in detail as follows.

After analyzing the reaction equations (1) and (2), it is found that titanium is dissociated from the solution of $H_2TiF_6$, accepts the electron hole to form a titanium ion, and is then reacted with hydroxide ion in water to generate titanium hydroxide. Finally, the dehydration is performed to generate titanium dioxide and hydrogen. The reaction equations are as follows:

  (3)

  (4)

  (5)

Taking a semiconductor silicon substrate as an example, there is a charge exchange between silicon and the electrolyte due to the chemical potential difference between silicon and the electrolyte, resulting in that the surface of silicon substrate lacks electron (i.e. silicon provides electron holes on the surface of silicon substrate) to generate a situation of Eq. (3). Hydroxide ion of Eq. (4) is dissociated from water. If water is provided sufficiently (i.e. the amount of hydroxide ion is sufficient), Eq. (4) can be performed quickly. Therefore, the bottleneck of overall reaction is the supplement of electron hole, that is, Eq. (3). If the electron hole can be supplied fully in the entire reaction, the reaction rate can be increased.

Because nitrous acid is often contained in nitric acid solution, both of them will spontaneously react with each other to provide a great number of electron hole as described in following reaction equations:

  (6)

  (7)

  (8)

  (9)

From Eq. (8), it is found that the electron hole can be generated in the solution after adding nitric acid therein. Because the number of electron hole is proportional to the concentration of nitric acid, Eq. (3) can be performed quickly, that is, the growth rate of titanium dioxide can be greatly increased.

Here, we propose two preferred embodiments. In the first preferred embodiment, the appropriate amount of nitric acid and boric acid are added to 20 ml hydrofluotitanic acid ($H_2TiF_6$) (6.1M). In the second preferred embodiment, only appropriate amount of nitric acid is added to 20 ml hydrofluotitanic acid. Thereafter, the precleaned silicon substrate is exposed to the mixed solution and the growth of titanium dioxide is performed at 40° C.

Please refer to FIG. 1 showing the relationship of the volume of boric acid to the thickness and refractive index of the titanium dioxide layer in the first preferred embodiment of the method according to the present invention. The growth conditions are: 20 ml hydrofluotitanic acid; 0.5 ml 0.2M nitric acid; 0–5 ml 0.1M boric acid; growth temperature of 40° C.; and growth time of 4 minutes. From the results, it is found that the thickness of the titanium dioxide layer is increased along with the increased volume of boric acid and the growth rate is increased from 68 Å/min to 140 Å/min, but the refractive index of the titanium dioxide layer is slightly reduced (from 2.056 to 1.981) as the volume of boric acid is increased. The reason why the the refractive index is reduced is that the denseness of the titanium dioxide layer is reduced as the growth rate becomes faster.

Figure 2:
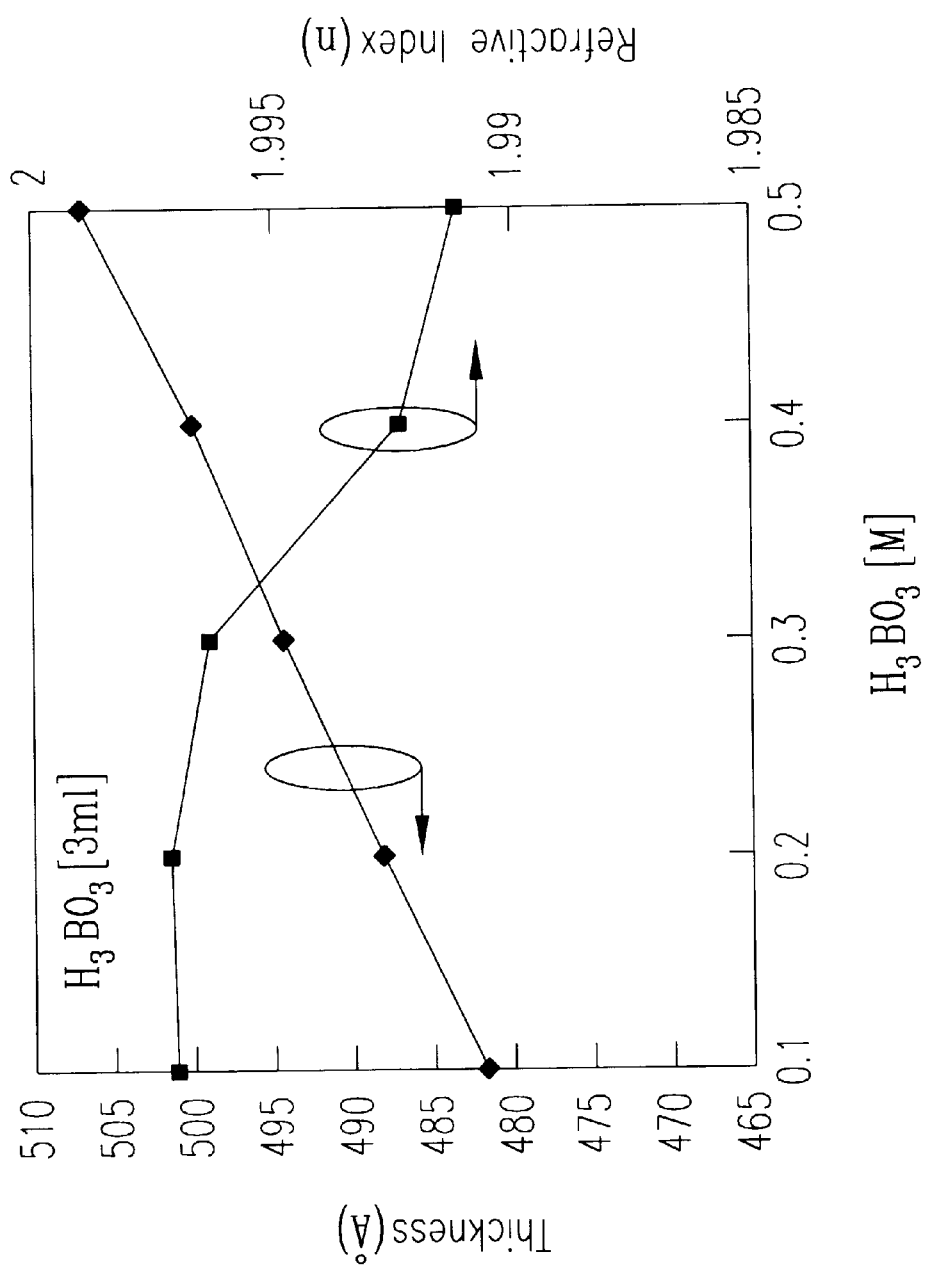
FIG. 2 is a graph showing the relationship between the concentration of boric acid and the thickness and refractive index of the titanium dioxide layer in the first preferred embodiment of the method according to the present invention.

Please refer to FIG. 2 showing the relationship of the concentration of boric acid to the thickness and refractive index of the titanium dioxide layer in the first preferred embodiment of the method according to the present invention. The growth conditions are: 20 ml hydrofluotitanic acid; 0.5 ml 0.2M nitric acid; 0.5 ml 0.1~0.5M boric acid; growth temperature of 40° C.; and growth time of 4 minutes. It is observed that the thickness of the titanium dioxide layer is increased along with the increased concentration of boric acid, and the growth rate is increased from 120 Å/min to 126 Å/min. However, there is little change in the refractive index of the titanium dioxide layer (from 1.997 to 1.991) when the concentration of boric acid is increased.

Figure 3A:
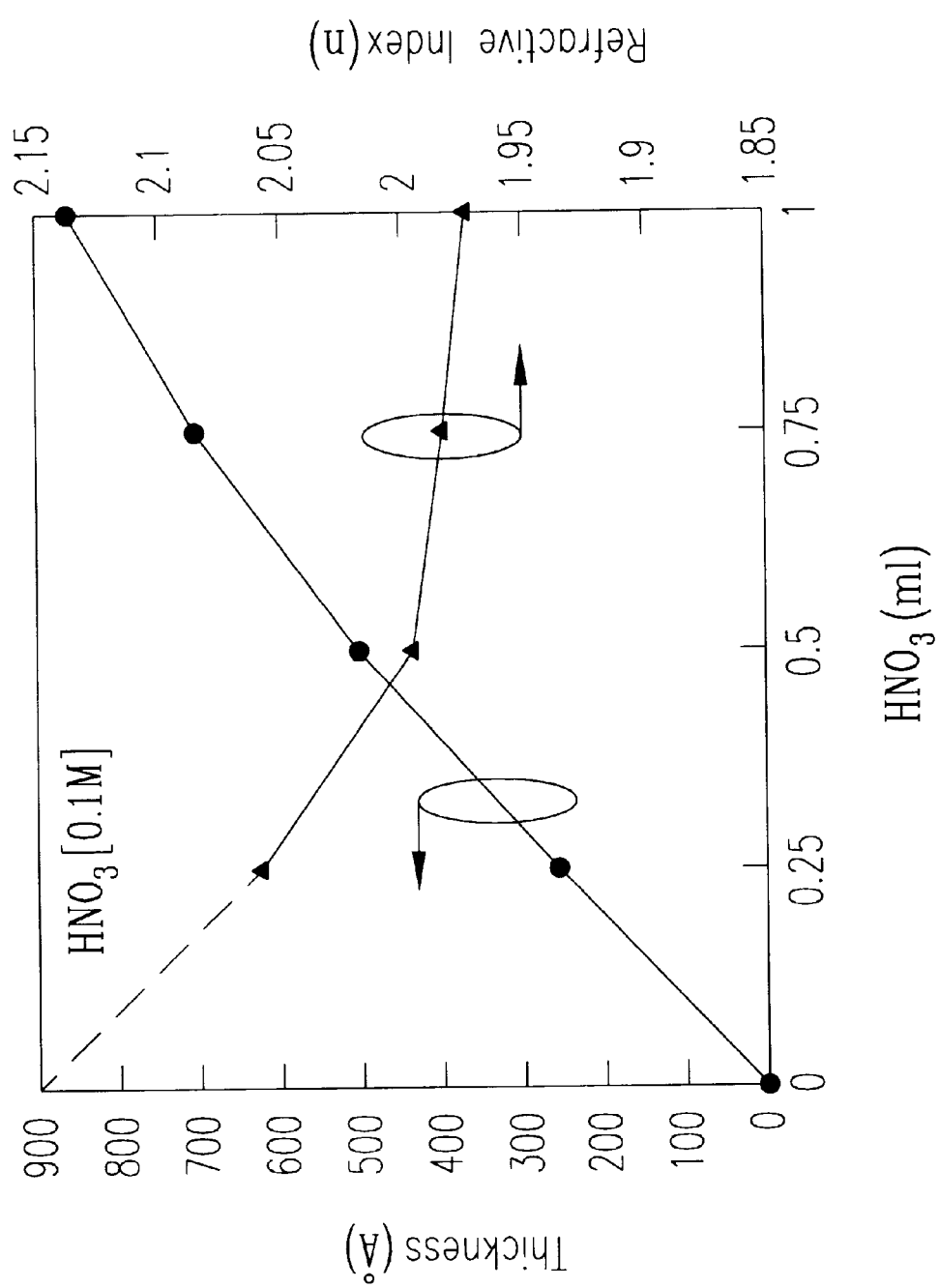
FIGS. 3a and 3b are graphs respectively showing the relationship between the volume of nitric acid and the thickness and refractive index of the titanium dioxide layer in the first and second preferred embodiments of the method according to the present invention.
Figure 3B:
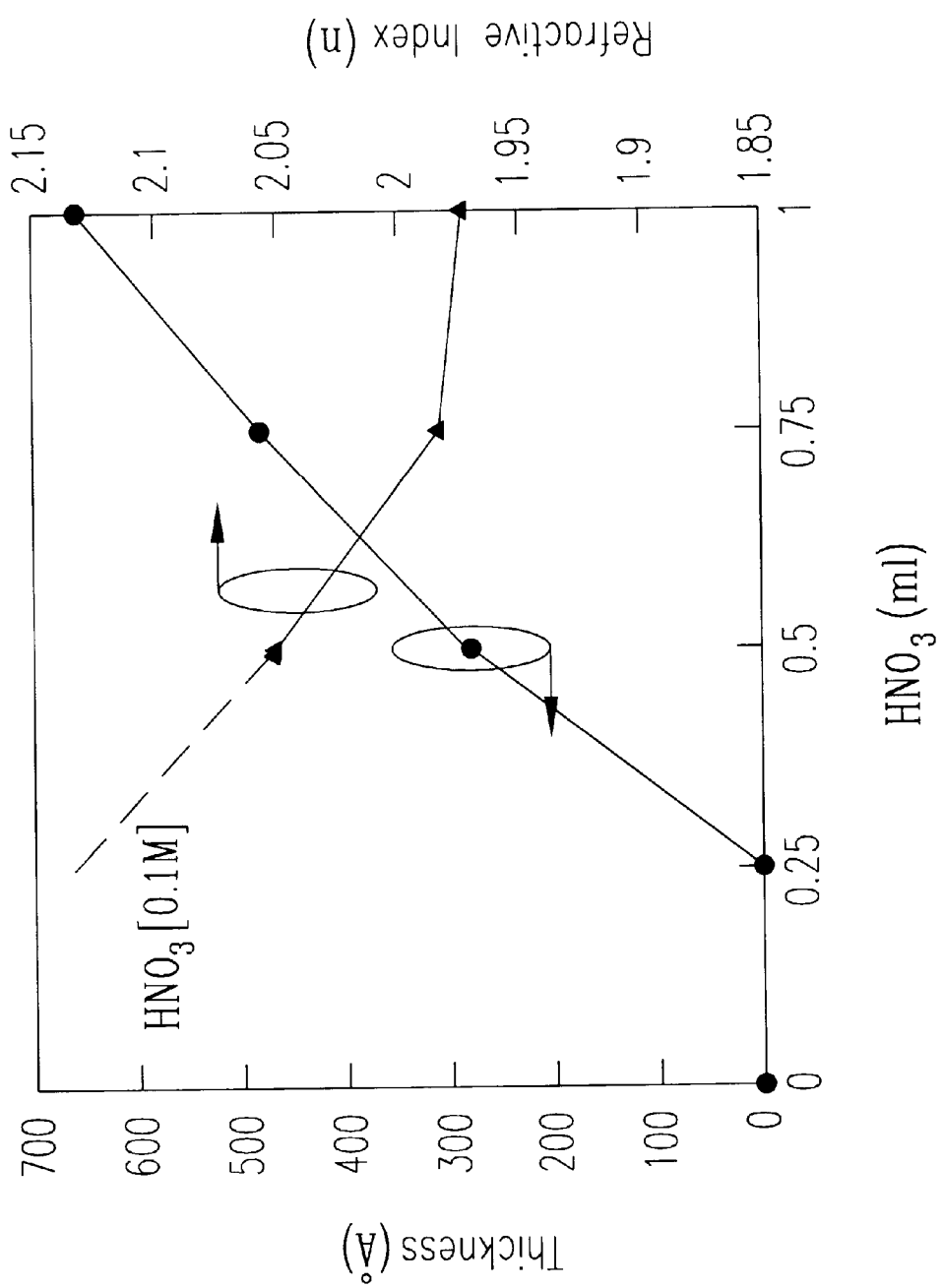

Please refer to FIGS. 3a and 3b respectively showing the relationship of the volume of nitric acid to the thickness and refractive index of the titanium dioxide layer in the first and second preferred embodiments of the method. The growth conditions used for these two embodiments are described as follows.

(1) The growth conditions of the first preferred embodiment are: 20 ml hydrofluotitanic acid; 0~1 ml 0.1M nitric acid; 3 ml 0.3M boric acid; growth temperature of 40° C.; and growth time of 4 minutes;

(2) The growth conditions of the second preferred embodiment are: 20 ml hydrofluotitanic acid; 0~1 ml 0.1M nitric acid; growth temperature of 40° C.; and growth time of 4 minutes.

In FIG. 3a, it is observed that the growth rate of the titanium dioxide layer is increased from 5.8 Å/min to 213 Å/min in the first preferred embodiment. In the second preferred embodiment, the growth rate of the titanium dioxide layer is increased from 0 Å/min to 162 Å/min as shown in FIG. 3b. However, in these two cases, the refractive index of the titanium dioxide layer is slightly reduced along with the increased volume of nitric acid (from 2.068 to 1.965 in the first preferred embodiment; from 2.052 to 1.983 in the second preferred embodiment).

Figure 4:
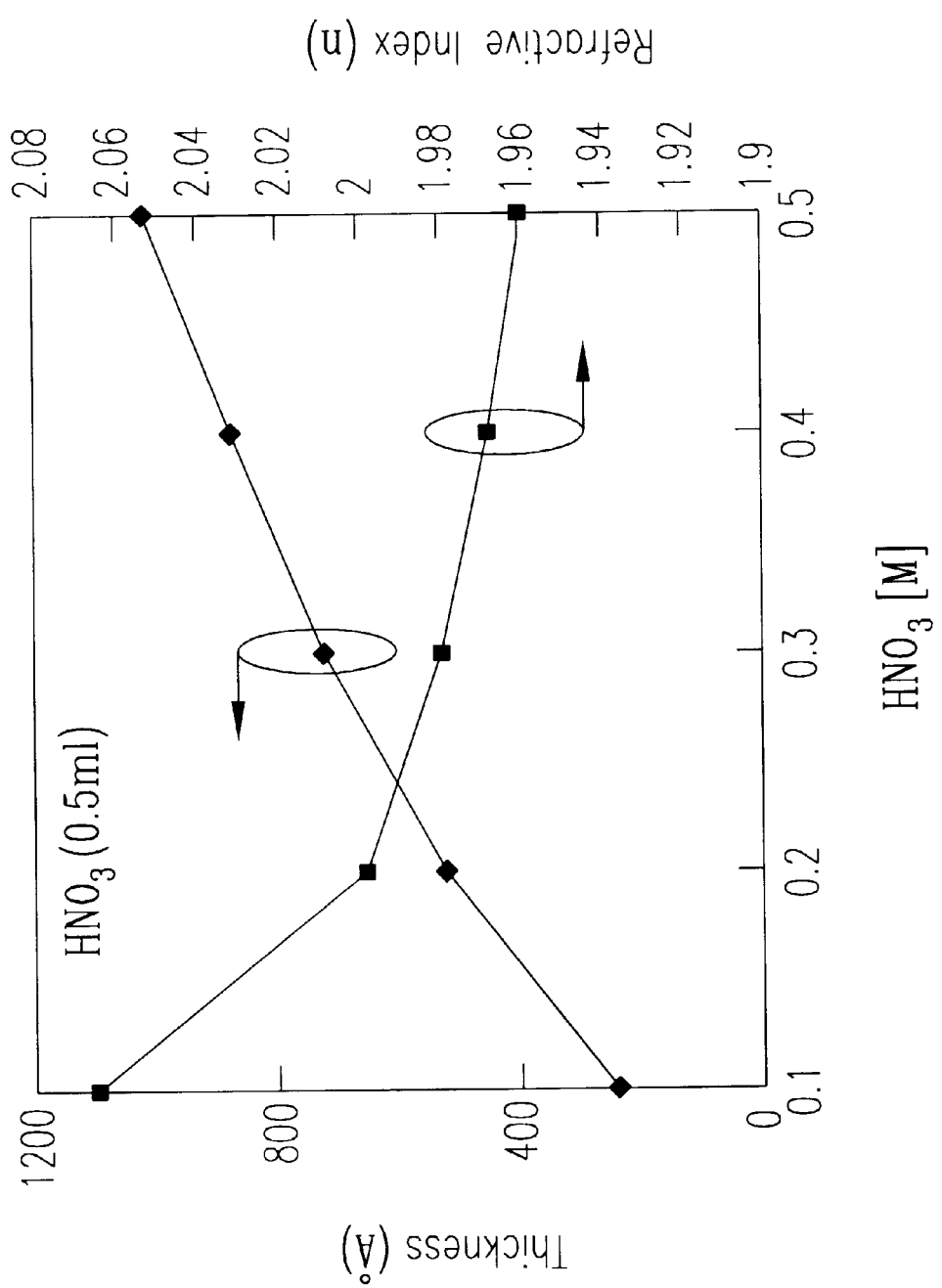
FIGS. 4a and 4b are graphs respectively showing the relationship between the concentration of nitric acid and the thickness and refractive index of the titanium dioxide layer in the first and second preferred embodiments of the method according to the present invention.
Figure 4B:
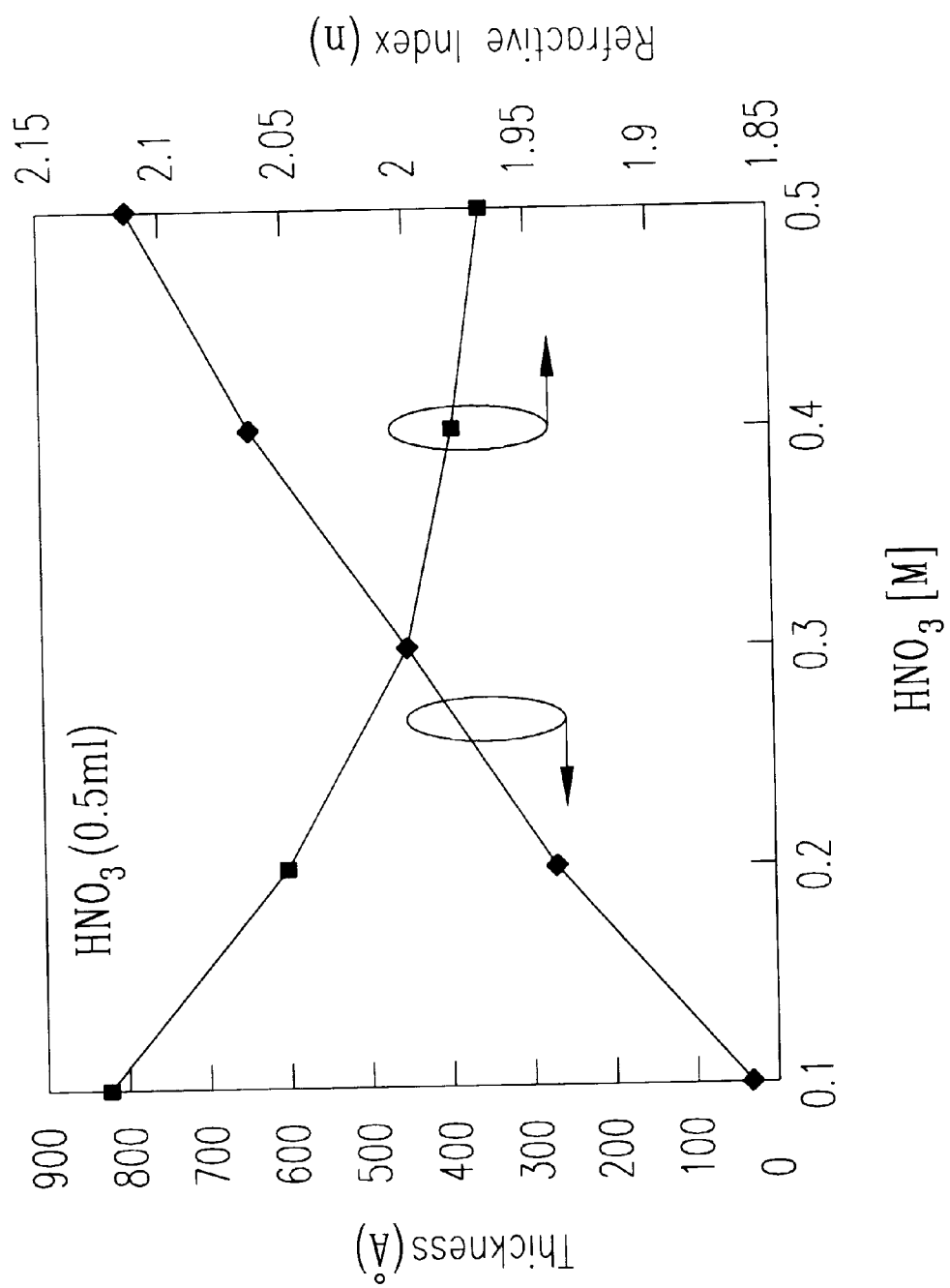

Please refer to FIGS. 4a and 4b respectively showing the relationship of the concentration of nitric acid to the thickness and refractive index of the titanium dioxide layer in the first and second preferred embodiments of the method. The growth conditions of these two embodiments are almost identical to those used in FIGS. 3a and 3b except that the concentration of nitric acid is ranged from 0.1 M to 0.5M and its volume is 0.5 ml.

The results show that the thickness of the titanium dioxide layer is increased along with the increased concentration of nitric acid. The growth rate of the titanium dioxide layer is increased from 58 Å/min to 239 Å/min in the first preferred embodiment (it can be seen from FIG. 4a). In the second preferred embodiment, the growth rate of the titanium dioxide layer is increased from 11 Å/min to 200 Å/min (shown in FIG. 4b). However, in these two cases, the refractive index of the titanium dioxide layer is lowered as the concentration of nitric acid is gradually increased (from 2.061 to 1.960 in the first preferred embodiment; from 2.113 to 1.970 in the second preferred embodiment).

Figure 5A:
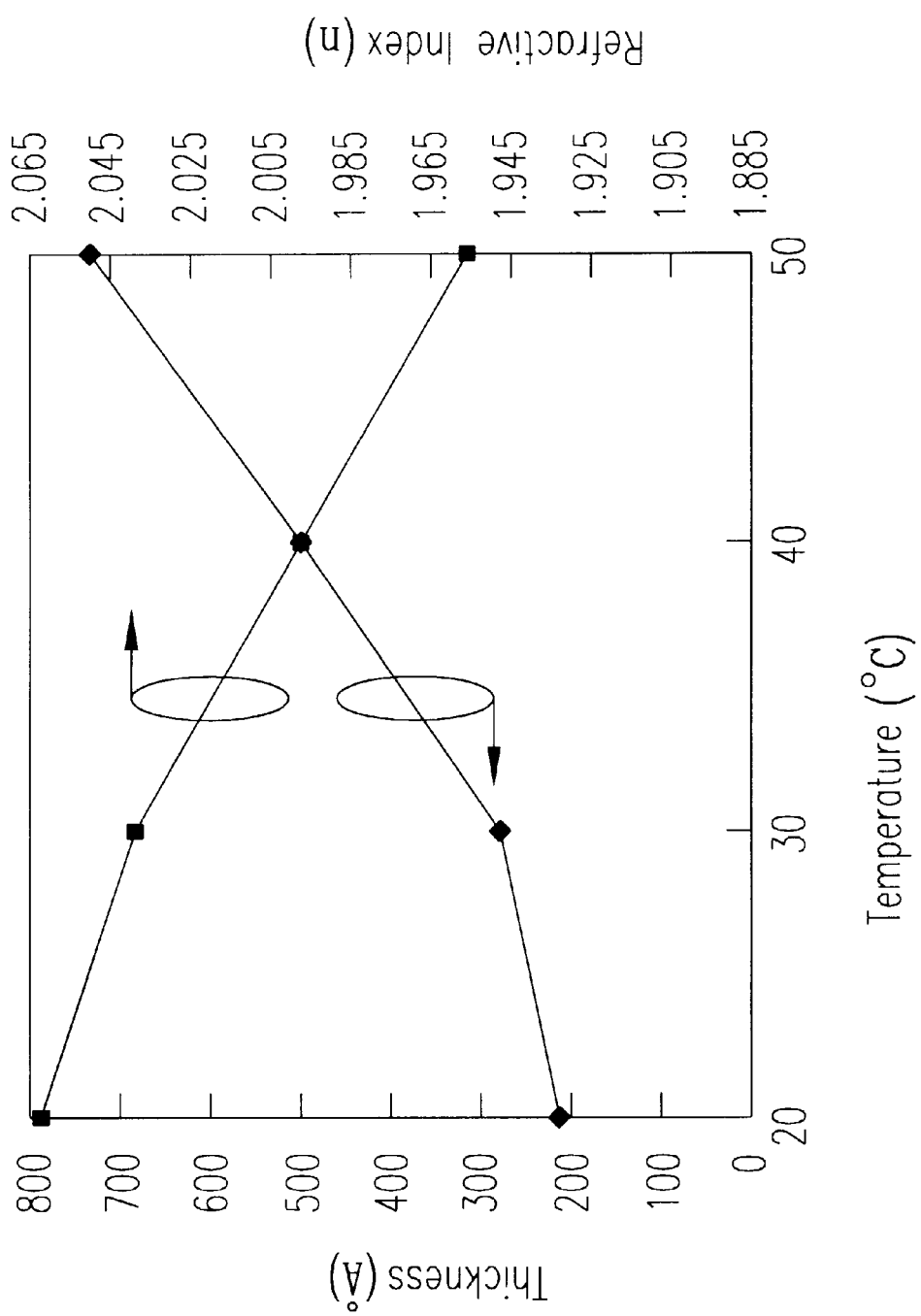
FIGS. 5a and 5b are graphs respectively showing the relationship between the growth temperature and the thickness and refractive index of the titanium dioxide layer in the first and second preferred embodiments of the method according to the present invention.
Figure 5B:
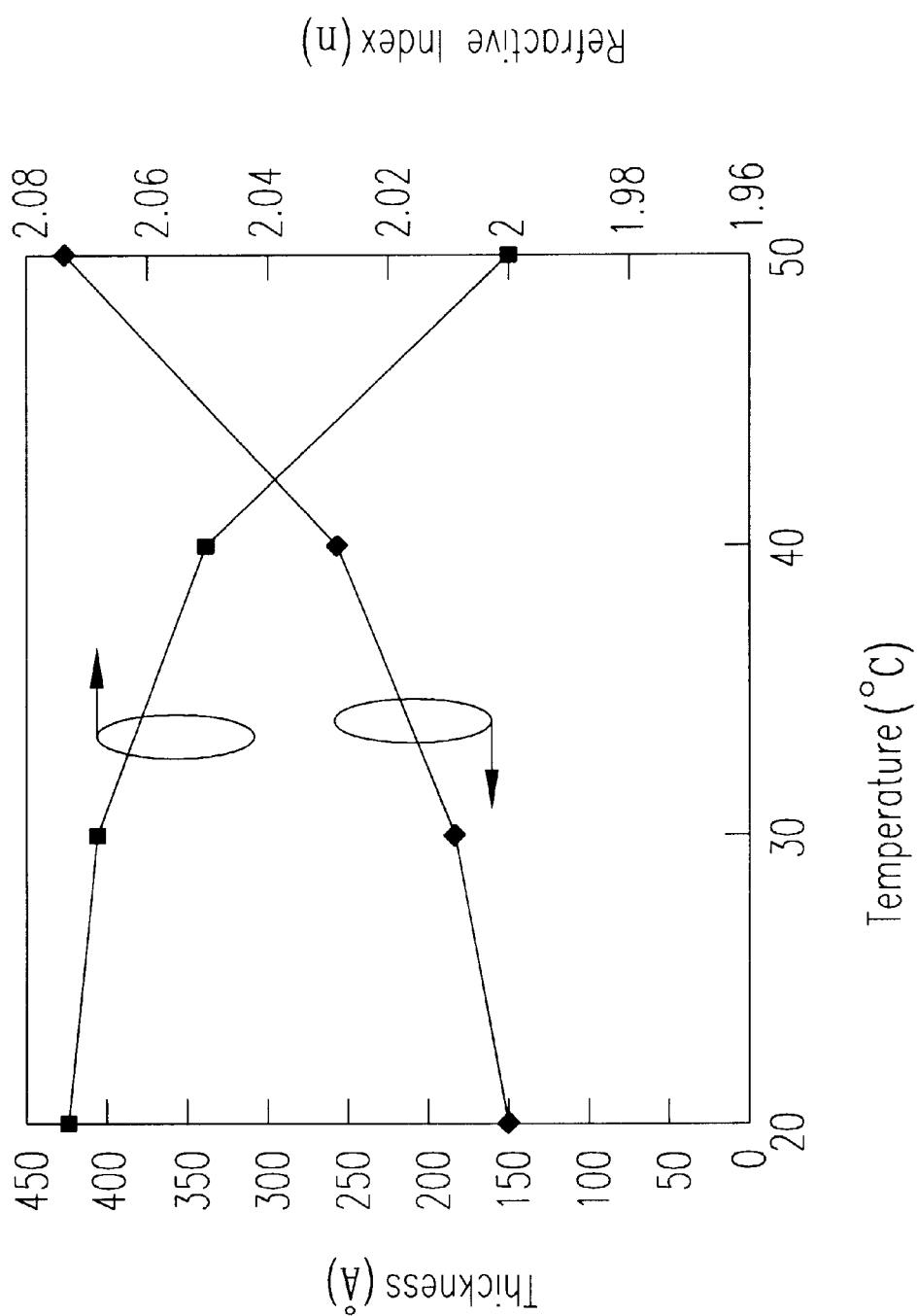

Now, please refer to FIGS. 5a and 5b respectively showing the relationship of the growth temperature to the thickness and refractive index of the titanium dioxide layer in the first and second preferred embodiments of the method. The growth conditions of these two embodiments are described as follows.

(1) The growth conditions of the first preferred embodiment are: 20 ml hydrofluotitanic acid; 0.5 ml 0.2M nitric acid; 3 ml 0.3M boric acid; growth temperature of 20~50° C.; and growth time of 4 minutes;

(2) The growth conditions of the second preferred embodiment are: 20 ml hydrofluotitanic acid; 0.5 ml 0.2M nitric acid; growth temperature of 20~50° C.; and growth time of 4 minutes.

The results show that the thickness of the titanium dioxide layer is increased along with the increased growth temperature. In the first preferred embodiment, the growth rate of the titanium dioxide layer is increased from 50 Å/min to 184 Å/min (it can be seen from FIG. 5a). In the second preferred embodiment, the growth rate of the titanium dioxide layer is increased from 37 Å/min to 106 Å/min (as shown in FIG. 5b). However, in these two cases, the refractive index of the titanium dioxide layer is reduced along with the increased growth temperature (from 2.065 to 1.950 in the first preferred embodiment; from 2.075 to 2.0 in the second preferred embodiment).

Figure 6A:
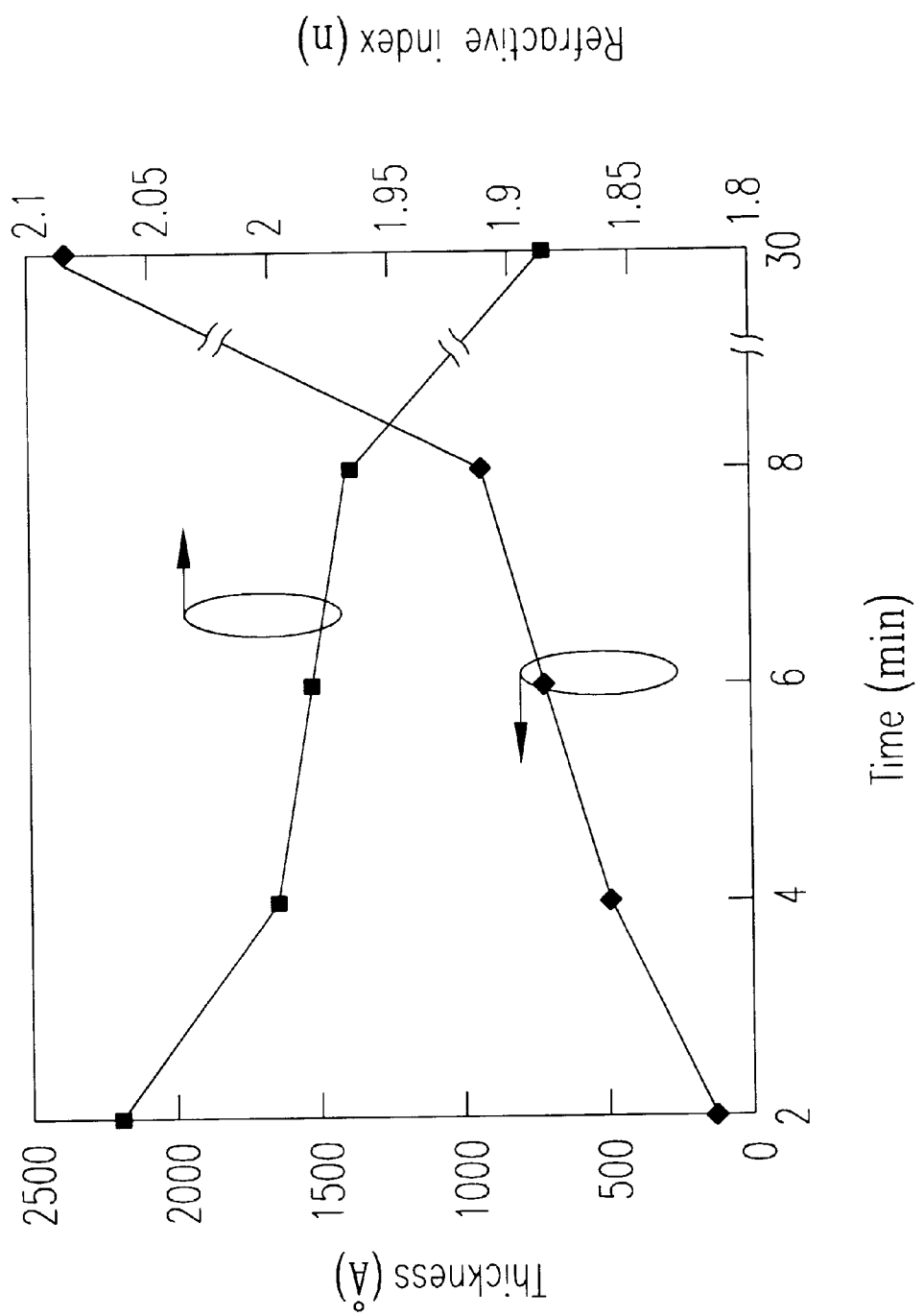
FIGS. 6a and 6b are graphs respectively showing the relationship between the growth time and the thickness and refractive index of the titanium dioxide layer in the first and second preferred embodiments of the method according to the present invention.
Figure 6B:
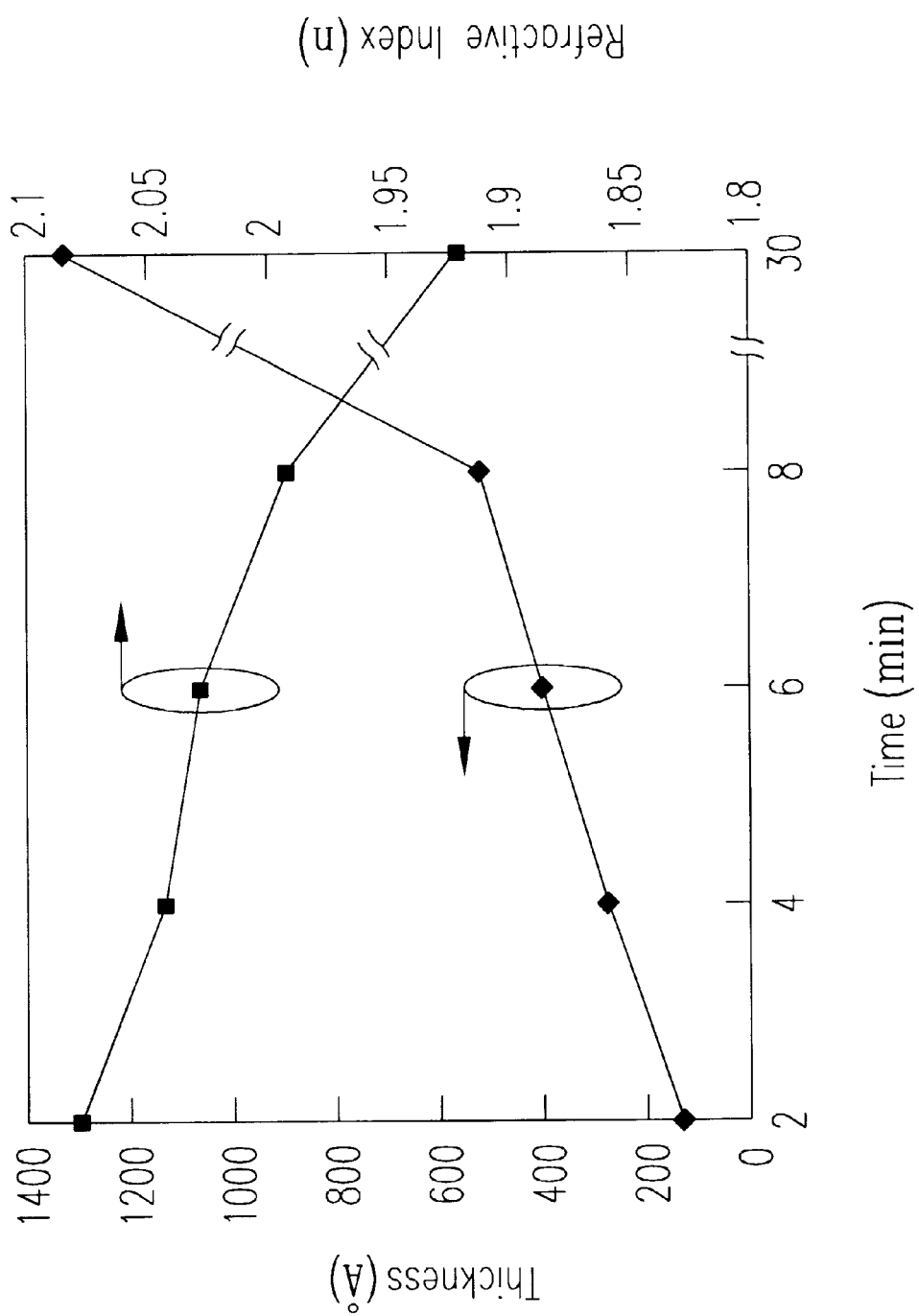

Finally, please refer to FIGS. 6a and 6b respectively showing the relationship of the growth time to the thickness and refractive index of the titanium dioxide layer in the first and second preferred embodiments of the method. All growth conditions of these two embodiments are the same as those described in FIGS. 5a and 5b except that the growth time is ranged from 2 min to 30 min.

It is observed that the titanium dioxide layer is thickened along with the increased growth time. In the first preferred embodiment, the growth rate of the titanium dioxide layer is reduced from 122 Å/min to 83 Å/min (see FIG. 6a). In the second preferred embodiment, the growth rate of the titanium dioxide layer is reduced from 66 Å/min to 43 Å/min (shown in FIG. 6b). However, in these two cases, the refractive index of the titanium dioxide layer is lowered when the growth time is increased (from 2.052 to 1.885 in the first preferred embodiment; from 2.068 to 1.923 in the second preferred embodiment).

To sum up, after adding nitric acid to the solution of hydrofluotitantic acid, the refractive index of the formed titanium dioxide layer is increased from 1.84 to 2.05 and its growth rate is increased from 6 Å/min to 197 Å/min.

Certainly, all conditions, including the concentration and volume of hydrofluotitanic acid, boric acid, or nitric acid, the growth temperature, and the growth time, used in the above-described examples should not be limited, because these parameters can adjusted according to a variety of the desired devices (e.g. a semiconductor device, a silicon substrate, an integrated circuit, a photoelectric device, etc.) to obtain the best effect. According to the method of the present invention, not only will the refractive index of the titanium dioxide layer be increased, but also its growth rate and stability will be enhanced to be applied in the production line.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for forming a titanium dioxide layer on a device, comprising:
   providing a titanium-containing material;
   adding an acid substance to said titanium-containing material to form a mixture, wherein said acid substance comprises nitric acid; and
   exposing said device to said mixture to form said titanium dioxide layer thereof.

2. The method according to claim 1 wherein said titanium-containing material is $H_2TiF_6$.

3. The method according to claim 2 wherein a concentration of said titanium-containing material is about 6M.

4. The method according to claim 1 wherein said acid substance comprises a mixture of nitric acid and boric acid.

5. The method according to claim 4 wherein a concentration of said boric acid is ranged from 0.1M to 0.5M.

6. The method according to claim 1 wherein a concentration of said nitric acid is ranged from 0.1M to 0.5M.

7. The method according to claim 1 wherein said titanium dioxide layer is formed by a liquid phase deposition.

8. The method according to claim 1 wherein said titanium dioxide layer is formed at a temperature ranged between 20° C. to 40° C.

9. The method according to claim 1 wherein said titanium dioxide layer is exposed to said mixture for 2 to 30 minutes.

10. A method for forming a titanium dioxide layer on a semiconductor device, comprising:
    cleaning said semiconductor device;
    Providing a titanium-containing material and adding an acid substance to said titanium-containing material to obtain a mixture, wherein said acid substance is nitric acid; and
    exposing said device to said mixture to form said titanium dioxide layer thereon.

11. The method according to claim 10 wherein said titanium-containing material is $H_2TiF_6$.

12. The method according to claim 11 wherein a concentration of said titanium-containing material is about 6M.

13. The method according to claim 10 wherein said acid substance is a mixture of nitric acid and boric acid.

14. The method according to claim 13 wherein a concentration of said boric acid is ranged from 0.1M to 0.5M.

15. The method according to claim 11 wherein a concentration of said nitric acid is ranged from 0.1M to 0.5M.

16. The method according to claim 10 wherein said semiconductive device is a silicon substrate.

17. The method according to claim 10 wherein said titanium dioxide layer is formed by a liquid phase deposition.

18. The method according to claim 10 wherein said titanium dioxide layer is formed at a temperature ranged between 20° C. to 40° C.

19. The method according to claim 10 wherein said titanium dioxide layer is exposed to said mixture for 2 to 30 minutes.

20. A method for forming a titanium dioxide layer on a silicon substrate of a semiconductor device, comprising:

cleaning said silicon substrate;

providing a titanium-containing material and adding an acid to said titanium-containing material to obtain a mixture, wherein said acid comprises nitric acid and boric acid; and exposing said silicon substrate to said mixture to form said titanium dioxide layer thereon, wherein a growth rate of said titanium dioxide layer is between 58 Å/min and 239 Å/min.

* * * * *